(12) United States Patent
Tangudu et al.

(10) Patent No.: US 10,979,262 B2
(45) Date of Patent: Apr. 13, 2021

(54) IQ MISMATCH CORRECTION FOR ZERO-IF/LOW-IF TX/RX

(71) Applicant: TEXAS INSTRUMENTS INCORPORATED, Dallas, TX (US)

(72) Inventors: Jawaharlal Tangudu, Bangalore (IN); Sthanunathan Ramakrishnan, Bangalore (IN); Jaiganesh Balakrishnan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/902,529

(22) Filed: Jun. 16, 2020

(65) Prior Publication Data

US 2020/0313944 A1 Oct. 1, 2020

Related U.S. Application Data

(63) Continuation of application No. 16/375,783, filed on Apr. 4, 2019, now abandoned.

(30) Foreign Application Priority Data

Apr. 4, 2018 (IN) .............................. 201841012763

(51) Int. Cl.
 *H04L 27/20* (2006.01)
 *H04B 1/40* (2015.01)
 *H04L 27/22* (2006.01)
(52) U.S. Cl.
 CPC ........... *H04L 27/2064* (2013.01); *H04B 1/40* (2013.01); *H04L 27/22* (2013.01)

(58) Field of Classification Search
 CPC ....... H04B 1/123; H04B 1/40; H04L 27/3863; H04L 27/2064; H04L 27/22
 See application file for complete search history.

(56) References Cited

U.S. PATENT DOCUMENTS

| 2007/0291883 | A1* | 12/2007 | Welz | H04B 1/30 375/350 |
| 2008/0159442 | A1* | 7/2008 | Tanabe | H04L 27/3863 375/324 |
| 2011/0268232 | A1* | 11/2011 | Park | H04L 5/001 375/344 |

* cited by examiner

*Primary Examiner* — Sung S Ahn
(74) *Attorney, Agent, or Firm* — John R. Pessetto; Charles A. Brill; Frank D. Cimino (57) ABSTRACT

IQ mismatch correction for analog chain IQ mismatch impairments is based on a two-filter architecture. In either RX or TX, an IQmc mismatch corrector (digital chain) filters I and Q digital signals, and includes an I-path to receive the I signal, and a Q-path to receive the Q signal, and is configured with two filters: an in-path filter to filter either the I signal or the Q signal received in the same path; and a cross-path filter to filter either the I signal or the Q signal received in the other path. The IQmc mismatch corrector can include: an I-path delay element to provide a delay to the I signal corresponding to a delay through either the in-path filter or the cross-path filter; and a Q-path delay element to provide a delay to the Q signal corresponding to a delay through either the in-path filter or the cross-path filter.

18 Claims, 5 Drawing Sheets

IQ MISMATCH CORRECTION FOR ZERO-IF/LOW-IF TX/RX

CROSS-REFERENCE TO RELATED APPLICATIONS

This application is a continuation of U.S. patent application Ser. No. 16/375,783, filed Apr. 4, 2019, which claims priority to India provisional application No. 201841012763, filed Apr. 4, 2018, both of which are incorporated herein by reference in their entirety.

BACKGROUND

Wireless infrastructure can employ zero-IF and low-intermediate frequency (zero/low-IF) architectures for TX and RX. An analog signal chain provides RF TX/RX, and a digital signal chain operates at baseband, commonly with DUC/DDC (digital upconversion/downconversion). The analog chain implements complex, quadrature (IQ) modulation/demodulation. The analog and digital signal chains are interfaced with a TX DAC or RX ADC.

The analog IQ chain includes a complex IQ modulator (TX), or demodulator (RX). Mismatches between the I and Q signal chains (IQ errors) include frequency independent gain/phase mismatch in the local oscillators, and frequency dependent mismatch errors in mixers and filter transfer functions, and delay errors through the I and Q signal paths. These I/Q mismatch errors lead to side-band leakage (I/Q imbalance).

TX/RX IQ mismatch in the analog chain can be corrected in the digital chain with digital TX/RX IQmc (IQ mismatch correction/compensation): at the TX end, the digital TX IQmc corrector essentially pre-distorts the baseband signal to compensate for IQ mismatch in the downstream analog IQ chain; at the RX end, the digital RX IQmc corrector corrects for IQ mismatch introduced by the upstream analog IQ chain.

IQmc corrector architectures commonly use filters to correct for IQ mismatch errors. The filter is a construct of a specified number of filter taps, with selectively assigned (estimated) coefficients, and associated MAC (multiply-accumulate) elements, and delay (Z transform) elements.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for IQ mismatch correction based on a two filter architecture, such as for use in an RF communications system with zero/low-IF TX or RX.

According to aspects of the Disclosure, a circuit to provide IQ mismatch correction can be used in a system for radio frequency (RF) communication including a transmit (TX) end, and/or a receive (RX) end. At either the TX end or the RX end, an analog signal chain includes analog circuitry that introduces IQ mismatch signal impairments, and a digital signal chain includes an IQ mismatch corrector to filter In-phase and Quadrature digital signals to provide IQmc correction to correct the IQ mismatch impairments. The IQ mismatch corrector, includes an I-path coupled to receive the In-phase digital signals (I signal), and a Q-path coupled to receive the Quadrature digital signals (Q signal). The IQmc mismatch corrector further includes two filter elements: an in-path filter element to filter either the I signal or the Q signal received in the same path; and a cross-path filter element to filter either the I signal or the Q signal received in the other path. The IQmc mismatch corrector can include: an I-path delay element included in the I-path to provide a delay to the I signal corresponding to a delay through either the in-path filter element or the cross-path filter element; and a Q-path delay element included in the Q-path to provide a delay to the Q signal corresponding to a delay through either the in-path filter element or the cross-path filter element.

According to other aspects of the Disclosure, a transceiver circuit for transmitting and receiving radio frequency (RF) communication signals, includes a transmit (TX) end, and a receive (RX) end. At the TX end and/or the RX end the circuit includes: an analog signal chain with analog circuitry that introduces IQ mismatch signal impairments; and a digital signal chain including an IQmc mismatch corrector to filter In-phase and Quadrature digital signals to provide IQmc correction to correct the IQ mismatch impairments. The IQmc mismatch corrector includes: an I-path coupled to receive the In-phase digital signals (I signal); and a Q-path coupled to receive the Quadrature digital signals (Q signal). the IQmc mismatch corrector further includes two filter elements: an in-path filter element to filter either the I signal or the Q signal received in the same path; and a cross-path filter element to filter either the I signal or the Q signal received in the other path. The IQmc mismatch corrector can include: an I-path delay element included in the I-path to provide a delay to the I signal corresponding to a delay through either the in-path filter element or the cross-path filter element; and a Q-path delay element included in the Q-path to provide a delay to the Q signal corresponding to a delay through either the in-path filter element or the cross-path filter element.

According to other aspects of the Disclosure, a method to provide IQ mismatch correction, for use in a system for radio frequency (RF) communication. The method is useable at a transmit (TX) end, and/or at a receive (RX) end in which an analog signal chain includes analog circuitry that introduces IQ mismatch signal impairments. The method comprises digital filtering, in an IQmc corrector, In-phase and Quadrature digital signals to provide IQmc correction to correct the IQ mismatch impairments. The digital filtering for IQmc correction is accomplished by: receiving, in an I-path, the In-phase digital signals (I signal); and receiving, in a Q-path, the Quadrature digital signals (Q signal); and filtering in an in-path filter element either the I signal or the Q signal received in the same path; and filtering in a cross-path filter element either the I signal or the Q signal received in the other path. The method can include: introducing a delay in the I-signal, with an I-path delay element included in the I-path, corresponding to a delay through either the in-path filter element or the cross-path filter element; an introducing a delay in the Q-signal, with a delay element included in the Q-path, corresponding to a delay through either the in-path filter element or the cross-path filter element.

Other aspects and features of the invention claimed in this Patent Document will be apparent to those skilled in the art from the following Disclosure.

BRIEF DESCRIPTION OF THE DRAWINGS

FIGS. 3A and 3B illustrate an example implementation of an IQmc corrector based on an IQmc two-filter architecture according to the Disclosure, with in-path ($g_i$) and cross-path ($g_q$) filter elements.

FIGS. 4A and 4B illustrates an example four-filter architecture for an IQ mismatch corrector 400: FIG. 4B illustrates an equivalent model for the four-filter IQmc corrector architecture 400; and.

FIGS. 5A-5C illustrate example alternate implementations of an IQmc corrector based on an IQmc two-filter architecture according to the Disclosure, with in-path ($g_i$) and cross-path ($g_q$) filter elements.

DETAILED DESCRIPTION

This Description and the Drawings constitute a Disclosure, including design examples and implementations, and including illustrating various technical features and advantages for: IQ mismatch correction based on a two-filter architecture, with in-path ($g_i$) and cross-path ($g_q$) filter elements.

This Disclosure uses the following nomenclature. IQmc (IQ mismatch correction/compensation) means digital correction/compensation for IQ mismatch (imbalance) introduced in an analog IQ chain, RX or TX: in the TX chain, the TX IQmc corrector essentially pre-distorts the baseband signal to compensate for IQ mismatch in the downstream analog IQ chain; and in the RX chain, the RX IQmc corrector compensates for IQ mismatch in the upstream analog IQ chain.

The IQmc corrector filters can be implemented in hardware or firmware, using coefficients that can be updated using on-line or off-line estimation. For the filters the HW/FW trade-off is typically based on operating frequency. For the example, IQmc correctors in this Disclosure, the IQmc filters are implemented in hardware, and updated with coefficients estimated in firmware.

The Disclosed example application for the IQmc two-filter architecture is an RF zero-IF receiver. The IQmc two-filter architecture according to the Disclosure is also applicable to TX IQmc correction, and to low-IF RX/TX architectures.

In brief overview, IQ mismatch correction for analog chain IQ mismatch impairments is based on a two-filter architecture. In either RX or TX, an IQmc mismatch corrector (digital chain) filters I and Q digital signals, and includes an I-path to receive the I signal, and a Q-path to receive the Q signal, and is configured with two filters: an in-path filter to filter either the I signal or the Q signal received in the same path; and a cross-path filter to filter either the I signal or the Q signal received in the other path. The IQmc mismatch corrector can include: an I-path delay element to provide a delay to the I signal corresponding to a delay through either the in-path filter or the cross-path filter; and a Q-path delay element to provide a delay to the Q signal corresponding to a delay through either the in-path filter or the cross-path filter.

Figure 1A:
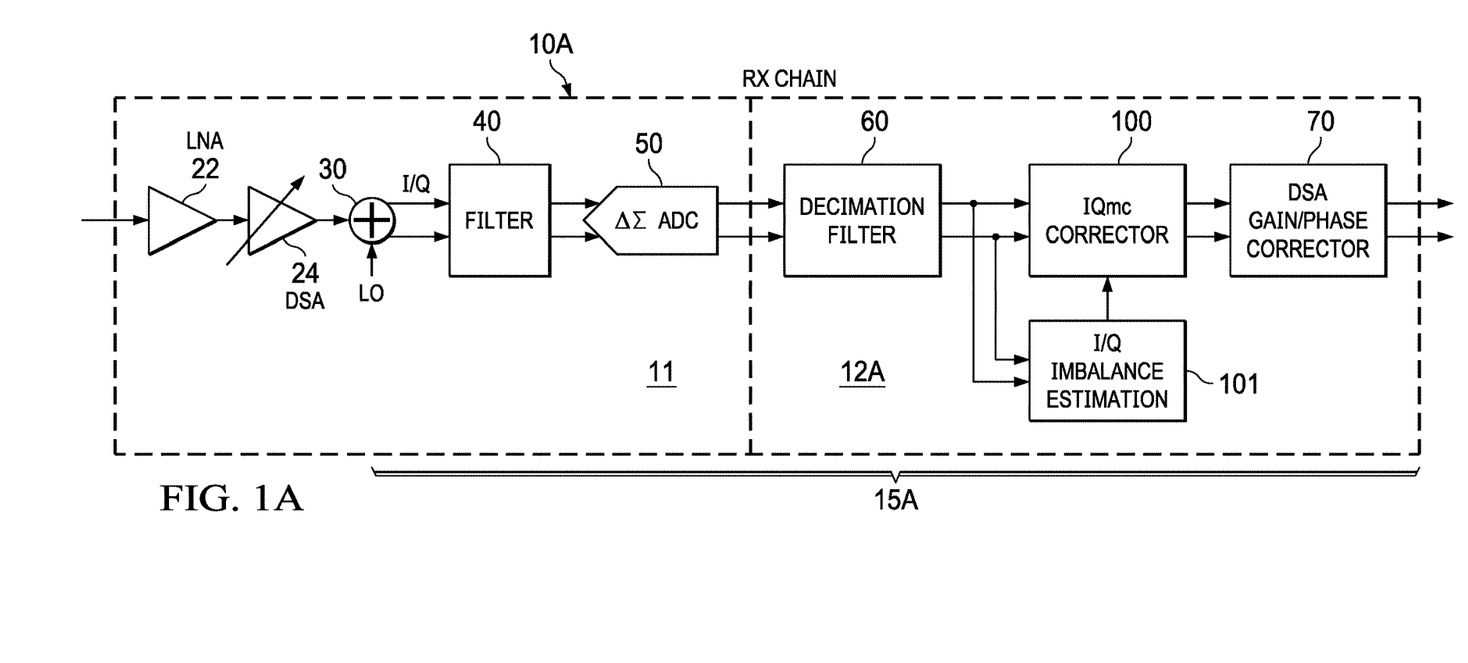
FIGS. 1A-1B illustrate example RF zero-IF receivers 10A/10B, each including an analog signal chain 11 with a complex RF IQ Demodulator 30, and a digital signal chain 12A/12B with an IQmc Corrector 100, configured with an IQmc two-filter architecture according to the Disclosure.
Figure 1B:
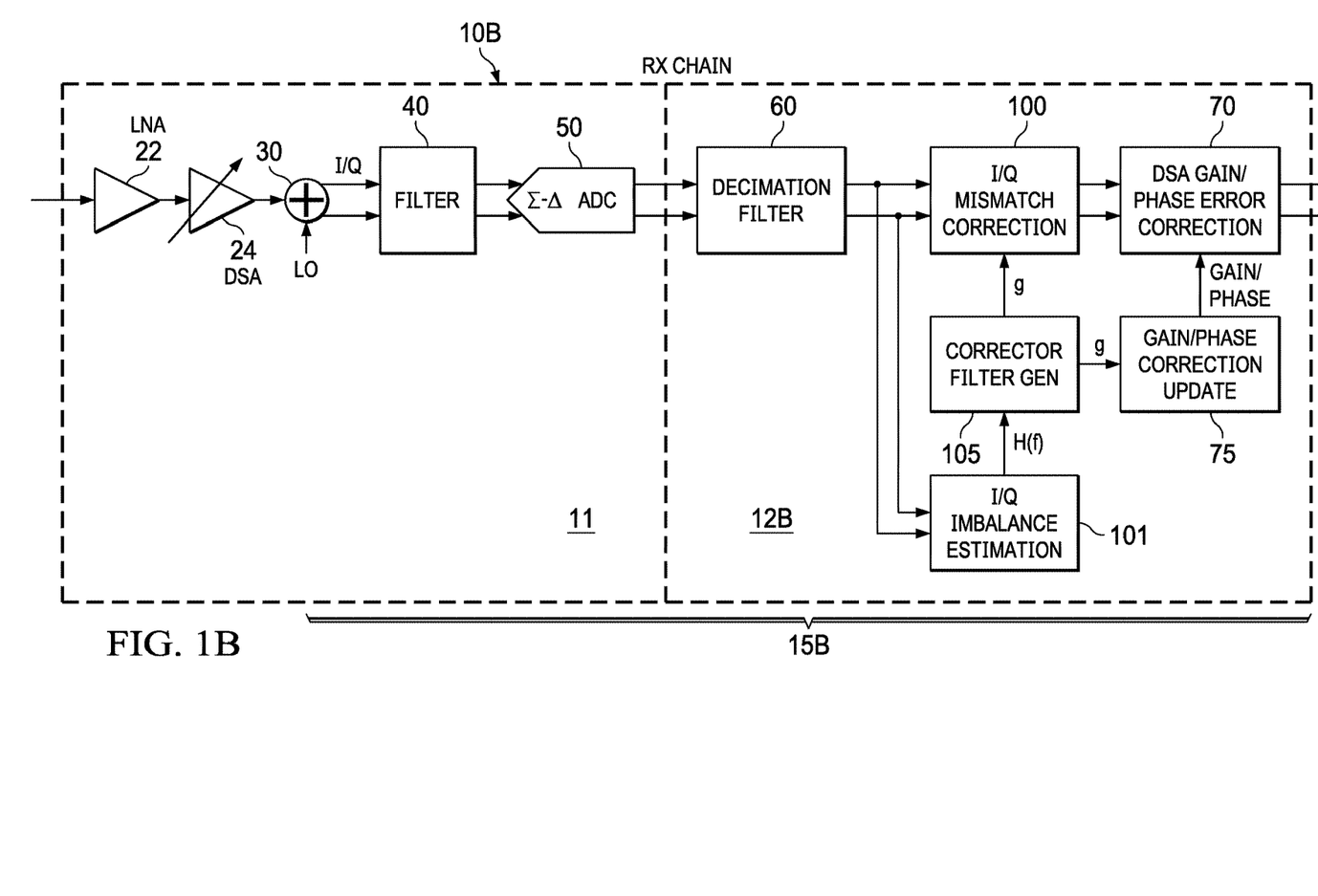

FIGS. 1A-1B illustrate example RF zero-IF receivers 10A/10B. The RX chain includes an analog receiver chain 11 with IQ demodulation, and digital IQ chains 12A/12B. The receivers include analog/digital IQ chains 15A/15B.

The analog chains 11 are identical, and include an RF input stage with LNA 22 and DSA 24, providing RF amplification and digital step attenuation, with RF input to a quadrature (IQ) Demodulator 30, driven by a local oscillator LO. The IQ Demodulator 30 and Filter 40 provide I and Q baseband signal inputs to a delta-sigma ADC 50, for conversion to digital I and Q streams input to the digital signal chain.

The digital chains 12A/12B each include a Decimation Filter 60, followed by an IQmc Corrector 100. IQmc Corrector 100 is implemented with a IQmc two-filter architecture according to the Disclosure.

IQmc Corrector 100 is followed by DSA Gain/Phase Corrector 70. As described below, the IQmc correction can affect linear response dependent upon the IQmc filter response. In FIG. 1B, the digital chain 15B includes an additional Gain/Phase Corrector Update module 75 to update the DSA Gain/Phase Corrector 70 to compensate for changes in linear response resulting from changes in IQmc correction.

Gain, phase, delay mismatch in the IQ Demodulator 30 (including the LO), and/or baseband Filters 40 operating on IQ signals results in IQ mismatch errors (imbalance or leakage), which limits SFDR (Spurious Free Dynamic Range) unless corrected.

Gain/phase mismatch in the LO results in frequency-independent IQ mismatch. Mismatch in IQ chain components, filter transfer functions, and LO delay, results in frequency-dependent IQ mismatch.

Figure 2:
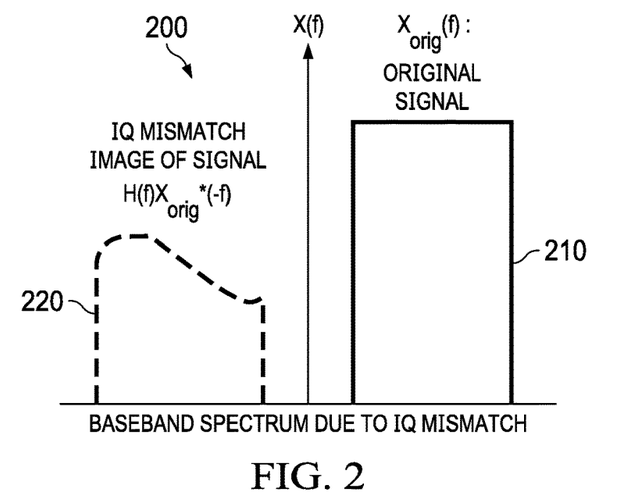
FIG. 2 provides example waveforms illustrating IQ mismatch, including an IQ mismatch image signal 220.

FIG. 2 provides example waveforms illustrating IQ mismatch, including an example RX signal 210, and its IQ mismatch image signal 220. Frequency dependent IQ mismatch generates images at a negative frequency reflected about DC. For example, an input tone at frequency f0 results in a IQ mismatch image at −f0. $X(f)=X_{orig}(f)+H(f) X_{orig}^*(-f)$, where Xorig(f) is the baseband equivalent input to the system, and X(f) is the output of the analog chain affected by IQ mismatch. H(f) is the IQ mismatch of the analog chain, which can be estimated by IQ mismatch estimator logic (on-line or off-line). The time domain equivalent of H(f), h(n), can also be computed by an IQ mismatch estimator, to enable IQ mismatch filter coefficient update. In general, h(n) is a complex filter, because the IQ mismatch H(f) is in general not conjugate symmetric about 0 Hz.

Figure 3A:
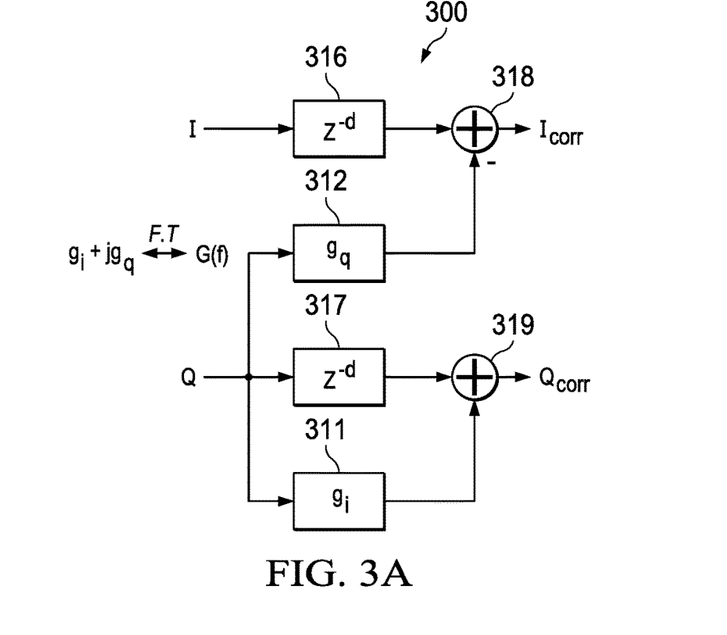
FIG. 3A illustrates an example two-filter IQmc corrector 300, with Q input to in-path and cross-path correction filters 311/312, providing IQ mismatch correction for both paths Icorr and Qcorr.
Figure 3B:
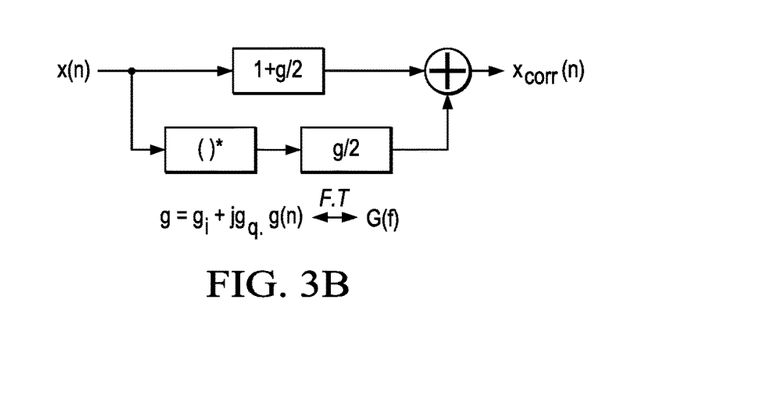
FIG. 3B illustrates an equivalent model for the two-filter IQmc corrector architecture 300, including a complex filter $g_i+jg_q$, with $g_i$ and $g_q$ filters ($g_i+jg_q$) to correct IQ mismatch.

FIGS. 3A and 3B illustrate an example implementation of an IQmc corrector based on an IQmc two-filter architecture according to the Disclosure. The IQmc two-filter architecture includes filters $g_i$ and $g_q$ ($g_i+jg_q$), and specifically, in-path ($g_i$) and cross-path ($g_q$) filter elements, configured to correct IQ mismatch.

FIG. 3A illustrates an example IQmc corrector 300 with Q-path input to in-path and cross-path correction filters 311/312 ($g_i$ and $g_q$). This example two-filter IQmc corrector architecture implements IQmc correction in both I and Q paths, outputting Icorr and Qcorr. The IQmc filter coefficients g(n), can be determined from G(f), which can be computed from H(f) according to:

$$G(f) = 2\frac{H(f)}{1-H(f)}$$

where H(f) is the IQ mismatch. The example IQ mismatch filters are implemented in hardware, with filter computation/update implemented in firmware. The output of the IQmc corrector is:

$$X_{corr}(f) \cong X_{orig}(f)(1+G(f)/2)$$

FIG. 3B illustrates an equivalent model for the IQmc corrector 300 including a complex filter ($g=g_i+jg_q$). The IQmc corrector effectively removes the IQ mismatch seen in the analog chain output due to its structure.

To reduce complexity of the computation of G(f) from H(f), an approximate filter can be used based on G(f)≅2H (f)(1+H(f)), or for further simplification, G(f)~=2H(f). Note that these relations in frequency domain can also be implemented directly in time domain if h(n) (the IQ mismatch estimate in time domain) is directly available. For example, G(f)≅2H(f)(1+H(f)) can be implemented as g(n)≅2h(n)+2h(n)*h(n), where * represents a convolution operation.

Figure 4A:
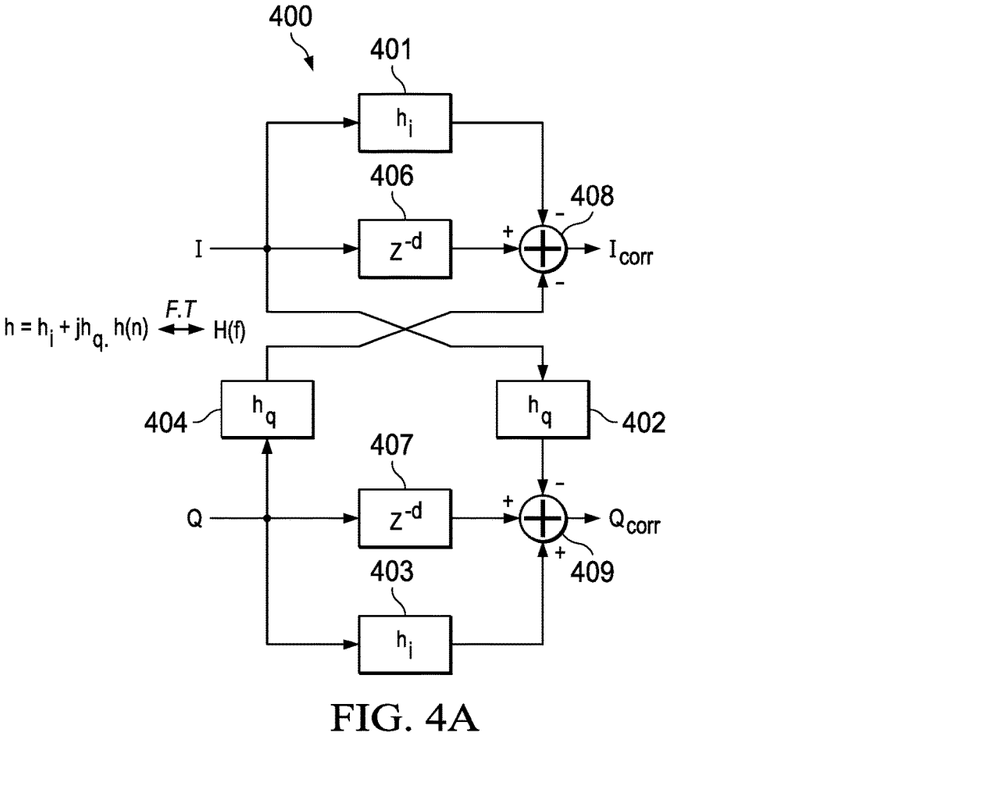
FIG. 4A illustrates and example (HW) implementation of a four-filter IQmc corrector 400.
Figure 4B:
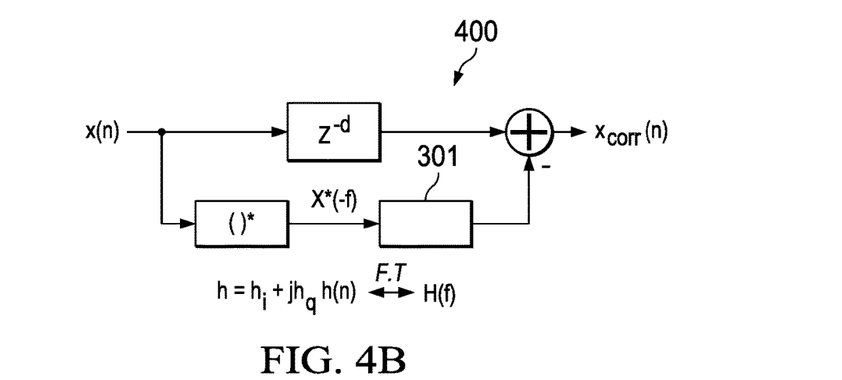

For comparison, FIGS. 4A and 4B illustrates an example four-filter architecture for an IQ mismatch corrector 400.

FIG. 4A illustrates an example implementation of a four-filter IQmc corrector 400, using four real filters (two in-path, and two cross-path). Each filter commonly uses a multi-tap FIR with tens of taps running at hundreds of MHz in RX, and at even higher rates in wideband TX. FIG. 4B illustrates an equivalent model for the four-filter IQmc corrector architecture 400.

The four filter architecture can be reconfigured as a three filter architecture, optimizing a complex multiplication to use three multiplies instead of four, with an extra addition. The higher complexity of such a 4 or 3 filter architecture is due to the number of coefficients running at high data rates.

Referring back to FIG. 3A, the Disclosed IQmc corrector architecture uses only two real filters, one in-path and one cross-path, while maintaining IQmc correction. The disclosed IQmc two-filter correction architecture enables filter design area/power that is 2/3 of a 3 filter structure, or 2/4 of a 4 filter structure.

Figure 5A:
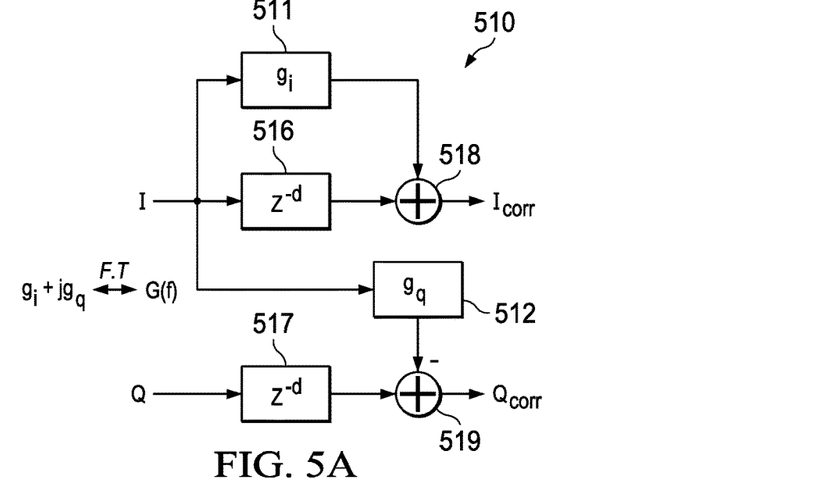
FIG. 5A illustrates an alternate IQmc corrector 510 (symmetrical with the IQmc corrector 300 in FIG. 3A), with I input to in-path and cross-path correction filters 511/512, and providing IQmc correction in both paths Icorr and Qcorr.
Figure 5B:
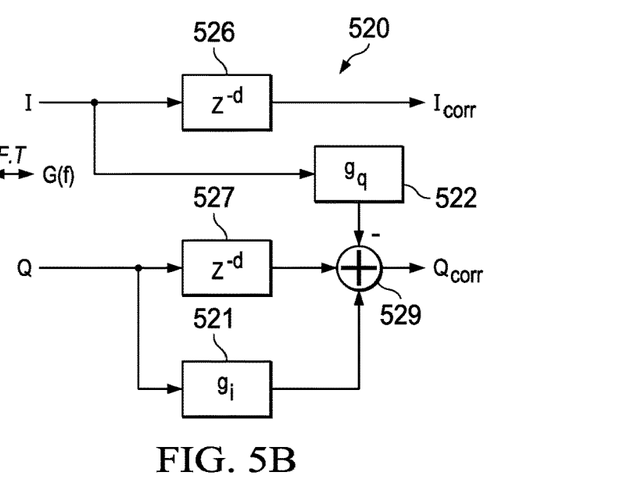
FIG. 5B illustrates an alternate IQ corrector 520 with I and Q input to in-path and cross-path correction filters 521/522, but with IQmc correction applied only to the Q-path Qcorr.
Figure 5C:
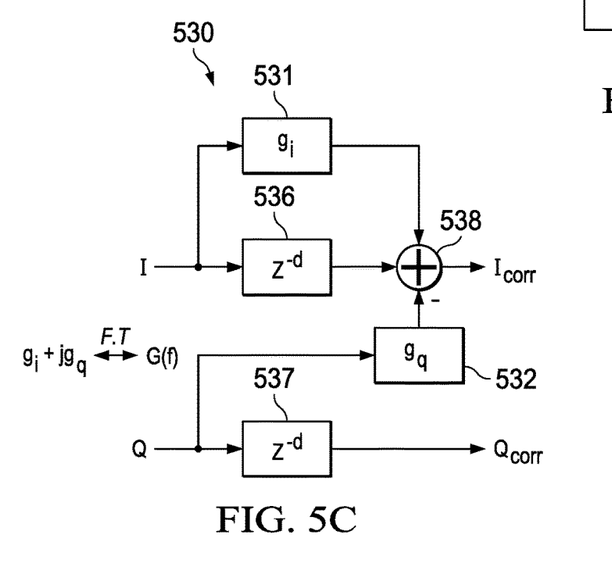
FIG. 5C illustrates an alternate IQ corrector 530 (symmetrical with the IQmc corrector 520 in FIG. 5B), with I and Q input to in-path and cross-path correction filters 531/532, and IQmc correction applied only to the I-path Icorr.

FIGS. 5A-5C illustrate example alternate implementations of an IQmc corrector based on a two-filter architecture according to the Disclosure, with different arrangements of in-path ($g_i$) and cross-path ($g_q$) filter elements, and IQmc correction.

FIG. 5A illustrates an alternate example two-filter IQmc corrector configuration 510, with a configuration symmetrical to the two-filter IQmc corrector 300 of FIG. 3A. IQmc corrector 510 includes I-path input to in-path and cross-path correction filters 511/512 ($g_i$ and $g_q$), and provides IQmc correction to both paths Icorr and Qcorr. Note, however, that the filter coefficients (G(f)) for the IQmc corrector 510 of FIG. 5A are not the same as the filter coefficients for FIG. 3A. The filter coefficients g(n) for the IQmc corrector architecture 5A can be computed based on:

$$G(f) = -2\frac{H^*(-f)}{1+H^*(-f)}$$

which is similar to the equation for the two-filter IQmc corrector 300 in FIG. 3A.

FIGS. 5B-5C illustrate alternate two-filter IQmc corrector configurations with both I-path and Q-path inputs through in-path and cross-path filter elements, but with IQmc correction applied in only one path (either Qcorr or Icorr).

FIG. 5B illustrates an alternate IQ corrector 520 with I-path and Q-path input to cross-path and in-path correction filters 522/521 ($g_i$ and $g_q$), providing IQmc correction on the Q path Qcorr.

The IQmc filter coefficients can be determined according to:

$$G(f) = 2H(f)\frac{1+H^*(-f)}{1-H(f)H^*(-f)}$$

where H(f) is the IQ mismatch estimate. That is, the IQmc filter coefficients G(f) are computed from IQmc mismatch estimates H(f) and H*(-f), with H* representing the conjugate of the IQ mismatch estimate.

IQmc filter computation can be solved if mismatch estimates H(f) are available for both $f_0$ and $-f_0$. If not, assumptions can be made about the missing frequency to enable filter coefficient computation. For example, it can be assumed that the missing estimate is the same as a nearby estimate, or if no nearby estimates are present, then it can be assumed that $H(f_0)=H^*(-f_0)$ (i.e., estimates are assumed to be conjugate symmetric). Or, if H(f) is small, higher order terms for computing G can be neglected. The output of the IQmc corrector is:

$$X_{corr}(f) \cong X_{orig}(f)(1+G^*(-f)/2)$$

FIG. 5C illustrates an example alternate IQmc corrector 530, that is symmetrical with the IQmc corrector 520 in FIG. 5B. IQmc corrector 530 uses I and Q input to in-path and cross-path correction filters 531/532 ($g_i$ and $g_q$), providing IQmc correction on the I path Icorr.

IQmc filter updates can cause changes in linear response of the signal based on the level of the IQmc correction (IQ imbalance). If IQmc correction is fixed, then the impact of IQmc correction on linear response of the signal is also fixed, and can be absorbed into the channel estimation, and therefore causes no decoding errors. However, a change in IQmc correction can cause a gain-step error (DSA step attenuation error) in the signal gain/phase, which can cause decoding errors. Such a change in IQmc correction can occur when IQ mismatch H(f) changes over time due to, for example, temperature changes.

For two-filter IQmc correction architectures according to the Disclosure, the impact on linear response can be on the order of the correction filter level, but the exact form varies with the type of two-filter architecture. For example, the two-filter architecture of FIG. 3A has an output which is Xcorr(f)=Xorig(f)(1+G(f)/2). But the two-filter architecture of FIGS. 5B (and 5C) has an output which is Xcorr(f)=Xorig (f)(1+G*(-f)/2). If the G(f) is not changing significantly with time, then this is equivalent to a small change in the linear response which can be estimated and corrected by the baseband receiver as part of channel estimation. A significant G(f) change, as can happen with periodic coefficient updates that can cause a step change in correction (i.e., a step-change coefficient update), can cause a step change in the linear response that can be difficult for the baseband receiver to adjust to. IQmc filter update affects the linear response by an amount dependent on the IQmc filter response.

Gain-step errors, such as resulting from changes in IQmc filter update, can be counteracted by updating DSA gain/phase error correction based on the linear error introduced by IQmc filter update, without affecting overall linear response. The DSA gain/phase error correction module corrects a gain and phase error introduced in the DSA. If a is the gain mismatch and θ is the phase mismatch introduced, then the analog signal is multiplied by $(1+\alpha)e^{j\theta}$, where α and θ are typically small and are also dependent on the current DSA setting used. To correct this the DSA gain phase corrector module multiplies the signal by $(1-\alpha)e^{-j\theta}$ to remove this error.

Referring to FIG. 1B, the digital chain 15B includes a DSA Gain/Phase Correction block 70 to correct DSA settings for gain-step errors and phase changes with DSA settings. The digital chain 15B includes an additional Gain/Phase Correction Update module 75 to update the DSA Gain/Phase Correction block 70 to compensate for the change in linear response according to aspects of the Disclosure.

For the example two-filter IQmc corrector architecture of FIG. 3A, the example Gain/Phase Correction Update module 75 updates the DSA Gain/Phase Corrector 70 to compensate for the change to the linear response resulting from a change/update in IQmc filtering. For example, the center tap of the IQmc filter, g(d)/2, can be added to the DSA Gain/Phase Corrector 70. In other words, the correction can be modified as $(1-\alpha-g_{ig}(d)/2)e^{-j(\theta+g_Q(d)/2)}$, where $g_{ig}(d)$ and $g_Q(d)$ are the real and imaginary parts of center tap g(d). If DSA Gain/Phase Corrector 70 is multi-tap, then g(d)/2 for the sub-set of available taps can be provided as the update to remove G(f)/2. This update to DSA gain/phase correction can be computed in firmware whenever the IQ mismatch estimation is updated by the IQ Imbalance Estimator 101.

An IQmc Imbalance Estimator 101 estimates the latest IQ mismatch estimate H(f), and sends it to the Corrector Filter Generator block 105. The Corrector Filter Generator 105 computes IQmc filter coefficients (g) from mismatch estimates H(f). Gain/Phase Correction Update module 75 computes the update needed for the DSA Gain/Phase Corrector 75, and also updates the DSA gain/phase coefficients. This update is applied with a delay to the DSA Gain/Phase Corrector 70 so that the samples for which the IQmc filter coefficients are updated, are also used to provide modified DSA gain/phase compensation.

The Disclosure provided by this Description and the Figures sets forth example designs and applications illustrating aspects and features of the invention, and does not limit the scope of the invention, which is defined by the claims. Known circuits, connections, functions and operations are not described in detail to avoid obscuring the principles and features of the Disclosed example designs and applications. This Disclosure can be used by ordinarily skilled artisans as a basis for modifications, substitutions and alternatives, including adaptations for other applications.

The invention claimed is:

1. A circuit to provide IQ mismatch correction for use in a system for radio frequency (RF) communication including a transmit (TX) end, and/or a receive (RX) end, the circuit comprising:
   at one of the TX end or the RX end, an analog signal chain and a digital signal chain:
   the analog signal chain including analog circuitry that introduces IQ mismatch signal impairments,
   the digital signal chain including an IQmc mismatch corrector to filter In-phase and Quadrature digital signals to provide IQmc correction to correct the IQ mismatch impairments, and
   an interface between the digital signal chain and the analog signal chain; and
   the IQmc mismatch corrector, including:
   an I-path coupled to receive the In-phase digital signals (I signal), and
   a Q-path coupled to receive the Quadrature digital signals (Q signal); and
   an in-path filter element to filter either the I signal or the Q signal received in the same path, and
   a cross-path filter element to filter either the I signal or the Q signal received in the other path;
   wherein the IQmc mismatch corrector to provides IQmc correction that results in a change in linear response through the analog and digital signal chains,
   the circuit further comprising:
   in the analog signal chain, a digital step attenuator (DSA) to provide a selected DSA step attenuation;
   in the digital signal chain,
   a DSA gain/phase correction block to provide a DSA correction signal to the DSA to correct the selected DSA step attenuation, and
   a DSA gain/phase correction update module to adjust the DSA correction signal to compensate for the change in linear response.

2. The circuit of claim 1, the IQmc mismatch corrector further including:
   an I-path delay element included in the I-path to provide a delay to the I signal corresponding to a delay through either the in-path filter element or the cross-path filter element; and
   a Q-path delay element included in the Q-path to provide a delay to the Q signal corresponding to a delay through either the in-path filter element or the cross-path filter element.

3. The circuit of claim 1, wherein
   the cross-path correction filter is connected from the Q-path to the I-path; and
   the in-path correction filter is connected in the Q-path;
   so that, the Q signal input is applied to the in-path and cross-path correction filters, and IQmc correction is provided for the I-path (Icorr) and the Q-path (Qcorr).

4. The circuit of claim 1, wherein
   the cross-path correction filter is connected from the I-path to the Q-path; and
   the in-path correction filter is connected in the I-path;
   so that, the I signal input is applied to the in-path and cross-path correction filters, and IQmc correction is provided for the I-path (Icorr) and the Q-path (Qcorr).

5. The circuit of claim 1, wherein
   the cross-path correction filter is connected from the I-path to the Q-path; and
   the in-path correction filter is connected in the Q-path;
   so that, the I signal input is applied to the cross-path correction filter, and the Q signal input is applied to the in-path correction filter, and IQmc correction is provided for the Q-path (Qcorr).

6. The circuit of claim 1, wherein
   the cross-path correction filter is connected from the Q-path to the I-path; and
   the in-path correction filter is connected in the I-path;

so that, the Q signal input is applied to the cross-path correction filter, and the I signal is applied to the in-path correction filter, and IQmc correction is provided for the I-path (Icorr).

7. The circuit of claim 1, wherein
the in-path and cross-path filter elements include filter coefficients selectively updated based on selectively estimated IQmc mismatch impairment; and
the in-path and cross-path filter elements are implemented in hardware, and the filter coefficients are selectively updated by computation in firmware based on estimated IQmc mismatch impairment.

8. A transceiver circuit for transmitting and receiving radio frequency (RF) communication signals, including a transmit (TX) end, and a receive (RX) end, at the TX end and/or the RX end the circuit comprising:
an analog signal chain, and including analog circuitry that introduces IQ mismatch signal impairments;
a digital signal chain including an IQmc mismatch corrector to filter In-phase and Quadrature digital signals to provide IQmc correction to correct the IQ mismatch impairments; and
an ADC (analog-to-digital conversion) circuitry to provide an interface between the analog signal chain and the digital signal chain;
the IQmc mismatch corrector including:
an I-path coupled to receive the In-phase digital signals (I signal), and
a Q-path coupled to receive the Quadrature digital signals (Q signal); and
an in-path filter element to filter either the I signal or the Q signal received in the same path, and
a cross-path filter element to filter either the I signal or the Q signal received in the other path;
wherein the IQmc mismatch corrector to provides IQmc correction that results in a change in linear response through the analog and digital signal chains, the circuit further comprising:
in the analog signal chain, a digital step attenuator (DSA) to provide a selected DSA step attenuation;
in the digital signal chain,
a DSA gain/phase correction block to provide a DSA correction signal to the DSA to correct the selected DSA step attenuation, and
a DSA gain/phase correction update module to adjust the DSA correction signal to compensate for the change in linear response.

9. The circuit of claim 8, the IQmc mismatch corrector further including:
an I-path delay element included in the I-path to provide a delay to the I signal corresponding to a delay through either the in-path filter element or the cross-path filter element; and
a Q-path delay element included in the Q-path to provide a delay to the Q signal corresponding to a delay through either the in-path filter element or the cross-path filter element.

10. The circuit of claim 8, wherein
the cross-path correction filter is connected from the Q-path to the I-path; and
the in-path correction filter is connected in the Q-path;
so that, the Q signal input is applied to the in-path and cross-path correction filters, and IQmc correction is provided for the I-path (Icorr) and the Q-path (Qcorr).

11. The circuit of claim 8, wherein
the cross-path correction filter is connected from the I-path to the Q-path; and
the in-path correction filter is connected in the I-path;
so that, the I signal input is applied to the in-path and cross-path correction filters, and IQmc correction is provided for the I-path (Icorr) and the Q-path (Qcorr).

12. The circuit of claim 8, wherein
the cross-path correction filter is connected from the I-path to the Q-path; and
the in-path correction filter is connected in the Q-path;
so that, the I signal input is applied to the cross-path correction filter, and the Q signal input is applied to the in-path correction filter, and IQmc correction is provided for the Q-path (Qcorr).

13. The circuit of claim 8, wherein
the cross-path correction filter is connected from the Q-path to the I-path; and
the in-path correction filter is connected in the I-path;
so that, the Q signal input is applied to the cross-path correction filter, and the I signal is applied to the in-path correction filter, and IQmc correction is provided for the I-path (Icorr).

14. The circuit of claim 8, wherein
the in-path and cross-path filter elements include filter coefficients selectively updated based on selectively estimated IQmc mismatch impairment; and
the in-path and cross-path filter elements are implemented in hardware, and the filter coefficients are selectively updated by computation in firmware based on estimated IQmc mismatch impairment.

15. A method to provide IQ mismatch correction, for use in a system for radio frequency (RF) communication, the method useable at a transmit (TX) end, and/or at a receive (RX) end in which an analog signal chain includes analog circuitry that introduces IQ mismatch signal impairments, the method comprising:
digital filtering, in an IQmc corrector, In-phase and Quadrature digital signals to provide IQmc correction to correct the IQ mismatch impairments;
the digital filtering for IQmc correction accomplished by:
receiving, in an I-path, the In-phase digital signals (I signal), and
receiving, in a Q-path, the Quadrature digital signals (Q signal), and
filtering in an in-path filter element either the I signal or the Q signal received in the same path, and
filtering in a cross-path filter element either the I signal or the Q signal received in the other path;
wherein the analog signal chain includes a digital step attenuator (DSA) to provide a selected DSA step attenuation, the method further comprising;
determining a change in linear response through the analog and digital signal chains that results from the digital filtering for IQmc correction; and
providing a correction signal to the DSA to adjust the selected DSA step attenuation to compensate for the change in linear response.

16. The method of claim 15, the IQmc mismatch corrector further comprising:
introducing a delay in the I-signal, with an I-path delay element included in the I-path, corresponding to a delay through either the in-path filter element or the cross-path filter element; and
introducing a delay in the Q-signal, with a delay element included in the Q-path, corresponding to a delay through either the in-path filter element or the cross-path filter element.

17. The method of claim 15, wherein the IQmc mismatch corrector is configured with the in-path filter element and the cross-path filter element arranged so that either:
- the IQmc correction is provided for the I-path (Icorr) and the Q-path (Qcorr); or
- the IQmc correction is provided for one of the I-path (Icorr) or the Q-path (Qcorr).

18. The method of claim 15, wherein:
- the in-path and cross-path filter elements include filter coefficients selectively updated based on selectively estimated IQmc mismatch impairment; and
- the in-path and cross-path filter elements are implemented in hardware, and the filter coefficients are selectively updated by computation in firmware based on estimated IQmc mismatch impairment.

\* \* \* \* \*